United States Patent
Hirukawa et al.

(10) Patent No.: US 10,399,169 B2
(45) Date of Patent: Sep. 3, 2019

(54) SOLDER SUPPLY DEVICE AND SOLDER SUPPLY METHOD

(71) Applicant: FUJI CORPORATION, Chiryu (JP)

(72) Inventors: Ritsuo Hirukawa, Nishio (JP); Takenobu Kato, Chiryu (JP); Kento Asaoka, Nishio (JP)

(73) Assignee: FUJI CORPORATION, Chiryu (JP)

( * ) Notice: Subject to any disclaimer, the term of this patent is extended or adjusted under 35 U.S.C. 154(b) by 344 days.

(21) Appl. No.: 15/122,032

(22) PCT Filed: Feb. 27, 2014

(86) PCT No.: PCT/JP2014/054901
§ 371 (c)(1),
(2) Date: Aug. 26, 2016

(87) PCT Pub. No.: WO2015/128994
PCT Pub. Date: Sep. 3, 2015

(65) Prior Publication Data
US 2017/0014931 A1    Jan. 19, 2017

(51) Int. Cl.
*B23K 3/00*    (2006.01)
*B23K 3/06*    (2006.01)
(Continued)

(52) U.S. Cl.
CPC .............. *B23K 3/0638* (2013.01); *B05C 5/00* (2013.01); *H05K 3/1233* (2013.01);
(Continued)

(58) Field of Classification Search
CPC .................................. B23K 3/0607; B05C 5/02
See application file for complete search history.

(56) References Cited

U.S. PATENT DOCUMENTS

| 4,517,917 A | * | 5/1985 | Santefort | B05C 5/02 118/300 |
| 4,934,309 A |   | 6/1990 | Ledermann et al. | |
| 2002/0050217 A1 | * | 5/2002 | Shimizu | B23K 1/0018 101/335 |

FOREIGN PATENT DOCUMENTS

| JP | 63-72372 A | 4/1988 |
| JP | 4-309460 A | 11/1992 |

(Continued)

OTHER PUBLICATIONS

JP04309460 computer english translation (Year: 1992).*

(Continued)

*Primary Examiner* — Erin B Saad
(74) *Attorney, Agent, or Firm* — Oblon, McClelland, Maier & Neustadt, L.L.P.

(57) ABSTRACT

A solder supply device is provided with solder cup housing liquid solder that is tubular and open at one end, a positive/negative pressure supply device capable of controlling the pressure inside the solder cup, a supply nozzle for dispensing solder from the solder cup, and a solder cutting device that cuts solder supplied from the supply nozzle by ejecting compressed air. Solder is supplied from the supply nozzle by increasing the pressure inside the solder cup using the positive/negative pressure supply device. When stopping the supply of solder from the supply nozzle, the pressure inside the solder cup is decreased using the positive/negative pressure supply device, and solder is cut by the solder cutting device to match the timing of pressure inside the solder cup decreasing.

14 Claims, 5 Drawing Sheets

(51) Int. Cl.
  *B05C 5/00* (2006.01)
  *H05K 3/12* (2006.01)
  *H05K 3/34* (2006.01)
  *B23K 101/42* (2006.01)

(52) U.S. Cl.
  CPC ........ *B23K 2101/42* (2018.08); *H05K 3/3484* (2013.01); *H05K 2203/0139* (2013.01)

(56) References Cited

FOREIGN PATENT DOCUMENTS

| JP | 6-285412 A | 10/1994 |
| JP | 2002-137360 A | 5/2002 |
| JP | 2004-58299 A | 2/2004 |
| JP | 2008-98364 A | 4/2008 |
| JP | 2011-31301 A | 2/2011 |

OTHER PUBLICATIONS

Extended European Search Report dated Nov. 28, 2017 in Patent Application No. 14883691.9.
International Search Report dated May 20, 2014, in PCT/JP2014/054901, filed Feb. 27, 2014.
Office Action dated Oct. 10, 2017 in Japanese Patent Application No. 2016-504938 (with English translation).
Combined Chinese Office Action and Search Report dated May 21, 2018 in corresponding Patent Application No. 201480076209.4 (with English Translation and English Translation of Category of Cited Documents), 12 pages.
Office Action dated Dec. 5, 2018 in European Patent Application No. 14 883 691.9, 9 pages.

* cited by examiner

SOLDER SUPPLY DEVICE AND SOLDER SUPPLY METHOD

TECHNICAL FIELD

The present disclosure relates to a solder supply device provided with a housing case that houses liquid solder, and a dispensing nozzle for dispensing solder housed in the housing case, that supplies solder from the dispensing nozzle by increasing the pressure inside the housing case.

BACKGROUND ART

Many solder supply devices are provided with a housing case that houses liquid solder, and a dispensing nozzle for dispensing solder housed in the housing case, and supply solder from the dispensing nozzle by increasing the pressure inside the housing case. Such devices also stop solder supply from the dispensing nozzle when a specified amount of solder has been supplied by stopping increasing the pressure inside the housing case. However, because solder is viscous, even when pressure is stopped being increased inside the housing case, there is a tendency for solder to droop and drip from the tip of the dispensing nozzle. Therefore, generally, solder supply devices are provided with a cutting device for cutting solder supplied from the dispensing nozzle. The following patent literature each disclose an example of a solder cutting device: patent literature 1 discloses technology for cutting solder using a linear member; patent literature 2 discloses technology for cutting solder by ejecting compressed air or the like.
Patent literature 1: JP-A-2002-137360
Patent literature 2: JP-A-2004-058299

SUMMARY

According to the solder cutting devices disclosed in the patent literature above, it is possible to prevent solder dripping from the dispensing nozzle to a certain degree. However, for solder supplied from a dispensing nozzle, there is a tendency for solder to droop from the cut surface of the solder when the solder is cut by a solder cutting device. The present disclosure takes account of such problems and an object thereof is to provide a solder supply device and solder supply method that reliably prevents dripping of solder.

To solve the above problems, the solder supply device comprises: a housing case that houses liquid solder inside; an internal pressure changing device that changes the pressure inside the housing case; a dispensing nozzle that dispenses solder housed in the housing case; a solder cutting device that cuts solder supplied from the dispensing nozzle using ejection of a gas; and a control device that controls operation of the solder cutting device and the internal pressure changing device, and the solder supply device supplies solder from the dispensing nozzle by increasing pressure inside the housing case using the internal pressure changing device, and the control device includes an internal pressure changing device control section that controls operation of the internal pressure changing device such that pressure inside the housing case decreases when supply of solder from the dispensing nozzle is stopped, and a solder cutting device control section that controls the solder cutting device such that solder is cut by ejecting a gas as pressure inside the housing case is decreased by control of the internal pressure changing device control section.

Further, in another embodiment of the solder supply device, the solder cutting device includes an outlet that opens across the entire region in a circumferential direction of an internal circumferential surface of the dispensing nozzle, and wherein the outlet ejects gas towards the inside of the dispensing nozzle.

Further, in another embodiment of the solder supply device, the solder cutting device includes multiple outlets arranged in a circumferential direction of an internal circumferential surface of the dispensing nozzle, and wherein each of the outlets ejects gas from a direction towards a center section in the diameter direction of the dispensing nozzle towards a direction deviated in one direction in the circumferential direction of the dispensing nozzle.

Further, in another embodiment of the solder supply device, multiple protruding sections that protrude towards the inside of the dispensing nozzle are formed on an internal circumferential surface of the dispensing nozzle positioned at an upstream side of the multiple outlets.

Further, in another embodiment of the solder supply device, the solder cutting device includes a chamber connected to the outlet to which air is supplied from the air supply device, and wherein an internal dimension of the outlet is smaller than an internal dimension of the chamber.

Further, in another embodiment of the solder supply device the solder supply device is provided with a surrounding wall that surrounds the outlet of the dispensing nozzle.

Further, the solder supply method is a solder supply method for supplying solder from a solder supply device provided with a housing case that houses liquid solder inside, an internal pressure changing device that changes the pressure inside the housing case, a dispensing nozzle that dispenses solder housed in the housing case, and a solder cutting device that cuts solder supplied from the dispensing nozzle using ejection of a gas; the solder supply method comprising: a supplying step of supplying solder from the dispensing nozzle by increasing pressure inside the housing case using the internal pressure changing device; a supply stopping step of stopping solder supply from the dispensing nozzle by decreasing the pressure inside the housing case using the internal pressure changing device; and a solder cutting step of cutting solder by blowing gas on the solder using the solder cutting device as pressure inside the housing case is decreased using the internal pressure changing device.

With the solder supply device, and with the solder supply method, pressure inside the housing case is decreased when supply of solder from the dispensing nozzle is stopped. Then, as the pressure inside the housing case decreases, the solder cutting device is operated to cut the solder by ejecting gas. Accordingly, because cutting of solder drooping from the dispensing nozzle and drawing back of solder drooping from the dispensing nozzle inside the dispensing nozzle are performed at the same time, it is possible to reliably prevent dripping of solder.

Further, in the another embodiment of the solder supply device, an outlet is open in the entire circumferential direction of an internal circumferential surface of the dispensing nozzle, and gas is ejected towards the inside of the dispensing nozzle. Accordingly, because gas is blown on the entire region of the circumferential direction of solder dispensed from the dispensing nozzle, solder is cut suitably.

Further, in the another embodiment of the solder supply device, multiple outlets are arranged in a circumferential direction of an internal circumferential surface of the dispensing nozzle, and each of the outlets ejects gas from a direction towards a center section in the diameter direction of the dispensing nozzle towards a direction deviated in one direction in the circumferential direction of the dispensing nozzle. Accordingly, solder dispensed from the dispensing nozzle twisted in one direction of the circumferential direction of the dispensing nozzle and cut by gas ejected from the multiple outlets.

Further, in the another embodiment of the solder supply device, multiple protruding sections that protrude towards the inside of the dispensing nozzle are formed on an internal circumferential surface of the dispensing nozzle positioned at an upstream side of the multiple outlets. Accordingly, the cross-section of solder dispensed from the dispensing nozzle is cross-shaped, star-shaped, or the like, and a protruding section that protrudes to the outside in the diameter direction is present on solder dispensed from the dispensing nozzle. And, by gas being ejected towards this protruding section, solder dispensed from the dispensing nozzle is effectively twisted. According, it is possible to suitably cut the solder.

Further, in the another embodiment of the solder supply device, gas is supplied to a chamber, and the chamber is connected to the outlet. Also, an internal dimension of the outlet is smaller than an internal dimension of the chamber. Accordingly, gas is ejected smoothly from the outlet such that the solder is suitably cut.

Further, in the another embodiment of the solder supply device, further provided is a surrounding wall that surrounds the outlet of the dispensing nozzle. Accordingly, for example, when cutting solder by ejecting gas, even if solder is scattered by the gas, scattered solder sticks to the surrounding wall. Thus, scattering of solder outside the solder supply device is prevented.

DESCRIPTION OF PREFERRED EMBODIMENTS

Figure 1:
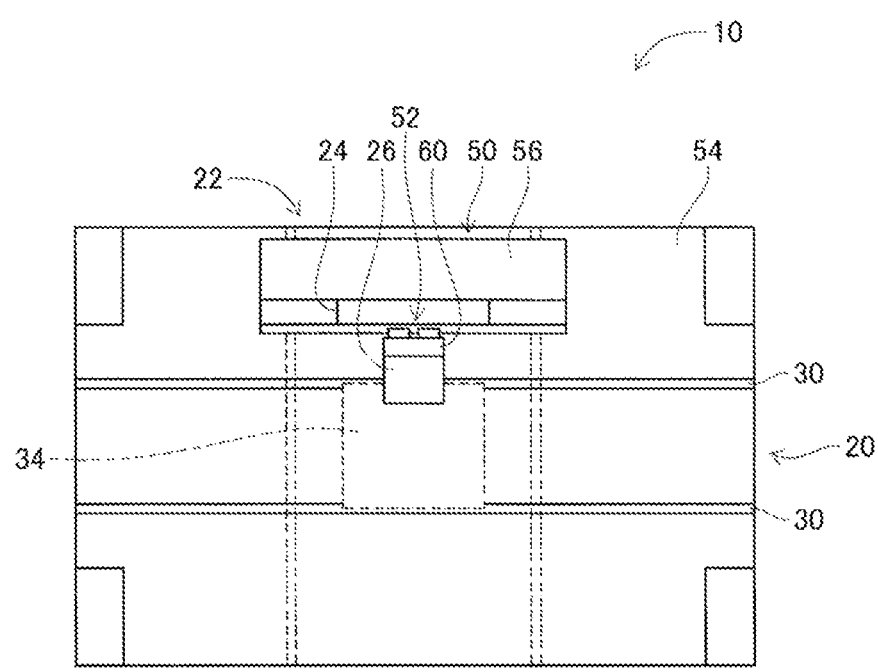
FIG. 1 is a plan view showing a solder printer of an embodiment.
Figure 1:
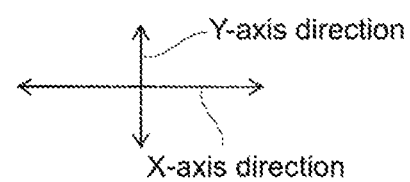

The following describes in detail referring to the figures an example embodiment of the present disclosure.
First Embodiment
Solder Printer Configuration FIG. 1 shows solder printer 10, an embodiment of the present disclosure. Solder printer 10 is a device that prints solder paste onto a circuit board. Solder printer 10 is provided with conveyance device 20, moving device 22, squeegee device 24, and solder supply device 26.

Conveyance device 20 has a pair of conveyor belts 30 that extend in the X-axis direction, and electromagnetic motor (refer to FIG. 5) 32 that rotates conveyor belts 30. The pair of conveyor belts 30 support circuit board 34 and circuit board 34 is conveyed in the X-axis direction by the driving of electromagnetic motor 32. Also, conveyance device 20 has holding device (refer to FIG. 5) 36. Holding device 36 fixedly holds circuit board 34 supported by conveyor belts 30 in a predetermined position (the position at which circuit board 34 is shown in FIG. 1). Note that a metal mask (not shown) is loaded on the upper surface of circuit board 34.

Moving device 22 is configured from Y-axis direction slide mechanism 50 and X-axis direction slide mechanism 52. Y-axis direction slide mechanism 50 has Y-axis slider 56 provided on base 54 so as to be movable in the Y-axis direction. Y-axis slider 56 is moved to any position in the Y-axis direction by the driving of electromagnetic motor (refer to FIG. 5) 58. Also, X-axis direction slide mechanism 52 has X-axis slider 60 provided on a side surface of Y-axis slider 56 to be movable in the X-axis direction. X-axis slider 60 is moved to any position in the X-axis direction by the driving of electromagnetic motor (refer to FIG. 5) 62.

Squeegee device 24 is attached to Y-axis slider 56 about conveyance device 20, and moves to any position above circuit board 34 that is held by conveyance device 20. Squeegee device 24 has a squeegee (not shown) and the squeegee is held extending downwards by squeegee device 24 to be movable in the Y-axis direction and the up/down directions. Further, the squeegee is moved in the Y-axis direction by the driving of electromagnetic motor (refer to FIG. 5) 66, and is moved up/down by the driving of electromagnetic motor (refer to FIG. 5) 68.

Figure 2:
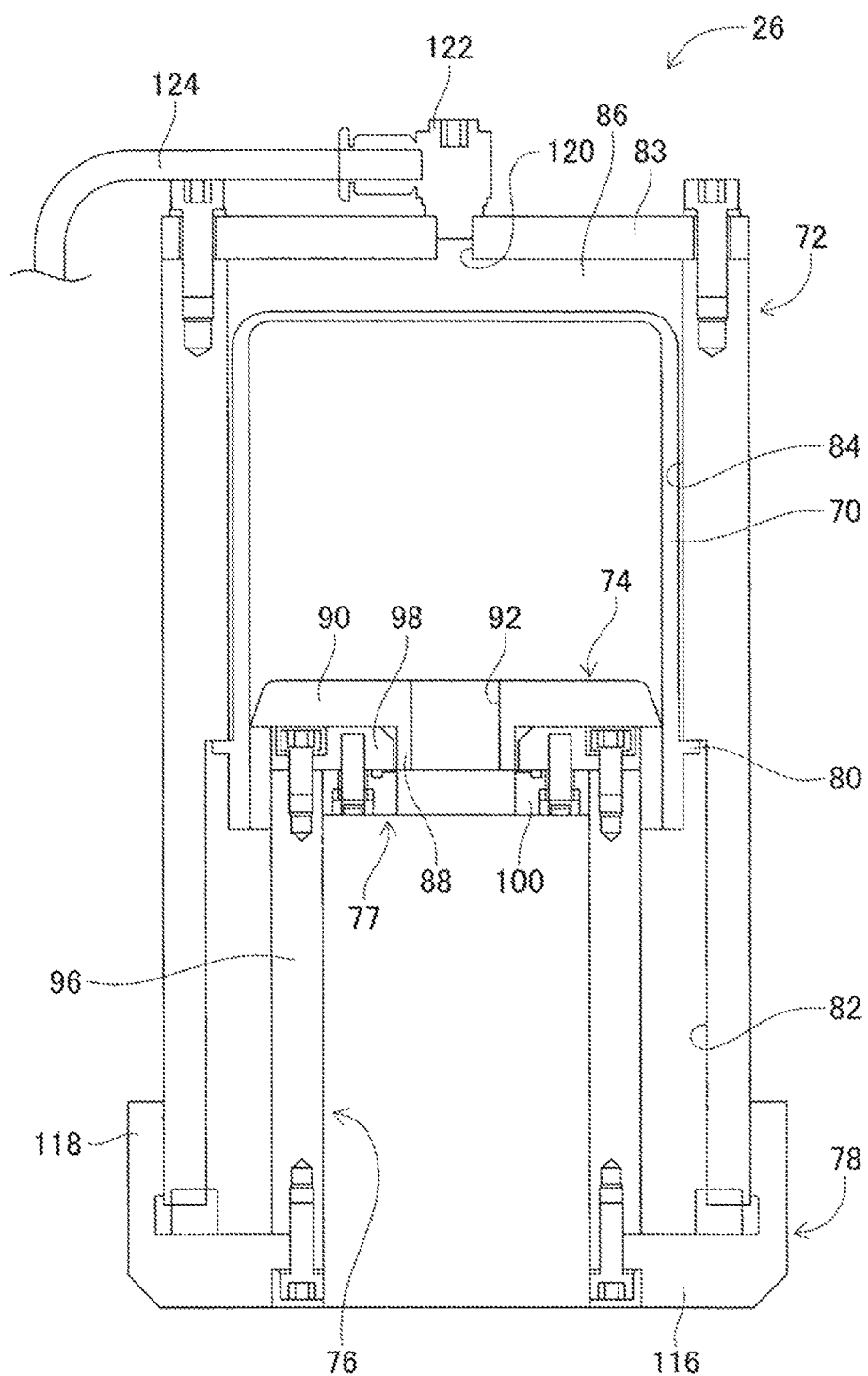
FIG. 2 is a cross-section view showing a solder supply device provided in the solder printer of FIG. 1.

Solder supply device 26 is detachably mounted on X-axis slider 60 and is moved to any position above base 54 by moving device 22. As shown in FIG. 2, solder supply device 26 has solder cup 70, outer tube 72, supply nozzle 74, inner tube 76, solder cutting device 77, and fixed lid 78. Solder cup 70 is a bottomed cylindrical container with an opening at one end; solder cup 70 is filled with solder paste. Flange section 80 is formed on the outer circumferential surface at the opening side of solder cup 70; a screw thread (not shown) is formed between flange 80 and the edge of the opening side. Solder cup 70 is sold commercially with a lid (not shown) that engages with the screw thread covering the opening. That is, solder paste manufacturers sell solder cups 70 after filling solder cups 70 with solder paste and covering the opening with a lid. Users purchase solder cups 70 and use them with the lid removed.

Also, outer tube 72 is a bottomed cylinder with an opening at one end; solder cup 70 is stored inside outer tube 72. In detail, the inner circumferential surface of outer tube 72 is configured from first inner circumferential surface 82 that is positioned at the opening side of outer tube 72, and second inner circumferential surface 84 that is positioned at bottom surface 83 of outer tube 72. The inside diameter of first inner circumferential surface 82 is slightly larger than the outer diameter of flange section 80 of solder cup 70; the inside diameter of second inner circumferential surface 84 is slightly larger than the outer diameter of the tubular section of solder cup 70. Further, the end of the bottom side of solder cup 70 is engaged from the opening of outer tube 72 such that solder cup 70 is stored in outer tube 72. By this, solder cup 70 is slidable inside outer tube 72. However, the depth dimension of a portion of second inner circumferential surface 84 of outer tube 72 is longer than the length dimension from flange section 80 of solder cup 70 to the bottom surface, and flange section 80 of solder cup 70 stored in outer tube 72 contacts the step surface between first inner circumferential surface 82 and second inner circumferential surface 84 of outer tube 72. Therefore, space 86 is formed between the bottom surface of solder cup 70 and bottom surface 83 of outer tube 72. Note that, herein, the bottom surface refers to the surface on the opposite side to the opening of a bottomed cylindrical member. In other words, even if the surface on the opposite side to the opening of a bottomed cylindrical member is positioned towards the top, and the opening is positioned towards the bottom, the surface on the opposite side to the opening is given as the bottom surface, not the lid.

Also, supply nozzle 74 is configured from nozzle section 88 and flange section 90; nozzle section 88 and flange section 90 are formed as one body from material that is elastically deformable. Nozzle section 88 is substantially cylindrical with nozzle hole 92 formed running through the inside. Flange section 90 extends in a disk shape from the outer circumferential surface of an end of the nozzle section; the outer diameter of flange section 90 is slightly larger than the inside diameter of solder cup 70. Also, flange section 90 is engaged inside solder cup 70 such that nozzle section 88 faces the opening side of solder cup 70; supply nozzle 74 slides inside solder cup 70 with the outer circumferential section of flange section 90 elastically deformed.

Further, inner tube 76 has cylindrical tube section 96, and ring section 98 that covers the edge of tube section 96; supply nozzle 74 is held by ring section 98. In detail, the outer diameter of nozzle section 88 of supply nozzle 74 is slightly larger than the inside diameter of ring section 98 of tube section 96, and nozzle section 88 is press-fitted into the inside diameter section of ring section 98. By this, inner tube 76 holds supply nozzle 74 using ring section 98. Note that, the length dimension of nozzle section 88 of supply nozzle 74 is the same as the thickness dimension of ring section 98 of tube section 96, and the bottom surface of nozzle section 88 press-fitted into the inside diameter section of ring section 98 and the bottom surface of ring section section 98 are positioned at the same height.

Figure 3:
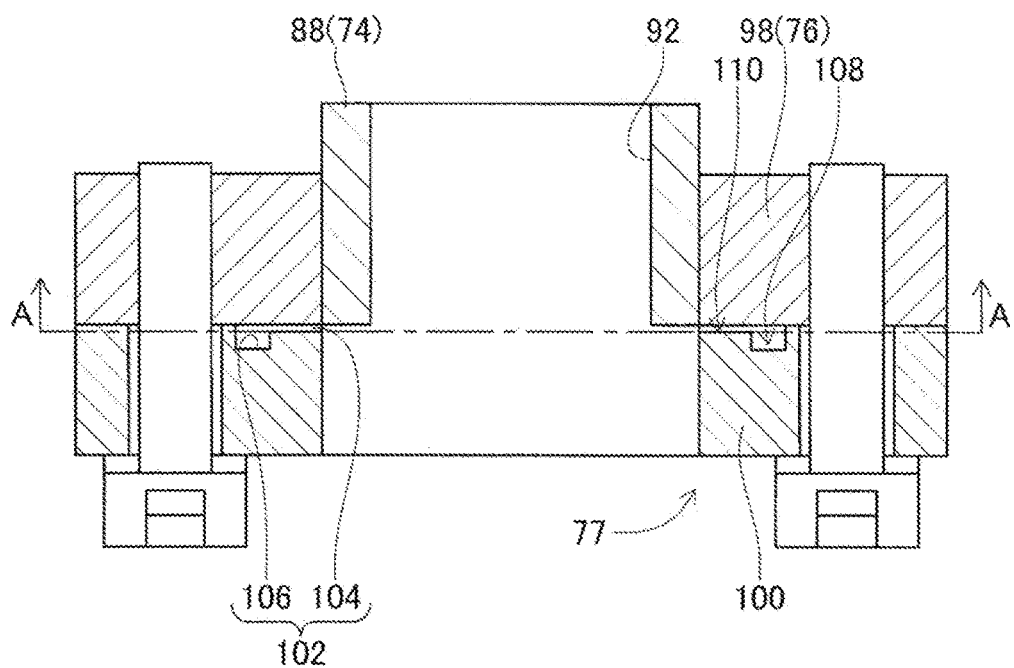
FIG. 3 is an enlarged cross-section view of the solder cutting device provided on the solder supply device of FIG. 2.
Figure 4:
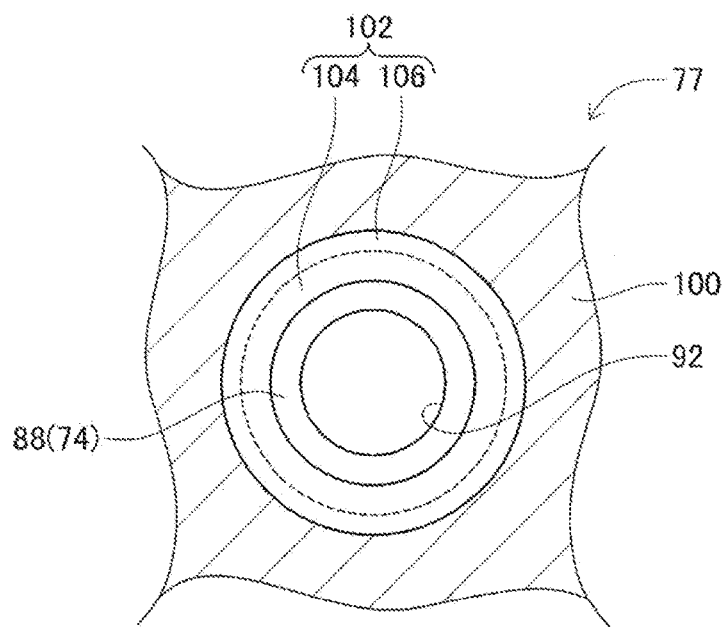
FIG. 4 is a cross section of line AA shown in FIG. 3.

Further, solder cutting device 77 includes ring-shaped air groove forming plate 100. The outer diameter of air groove forming plate 100 is slightly smaller than the inside diameter of tube section 96 of inner tube 76; the inside diameter of air groove forming plate 100 is approximately the same as the inside diameter of ring section 98 of inner tube 76. And, air groove forming plate 100 is inserted inside tube section 96 and fixed to a lower surface of ring section 98. Further, as shown in FIGS. 3 and 4, air groove 102 is formed around the entire circumference of the inner edge of the upper surface of air groove forming plate 100. Note that, FIG. 3 is an enlarged view of air groove forming plate 100 fixed to ring section 98, and FIG. 4 is a cross section of line AA shown in FIG. 3.

Air groove 102 is configured from first groove section 104 positioned at the inside edge side of air groove forming plate 100, and second groove section 106 positioned to the outside of first groove section 104; second groove section 106 is deeper than first groove section 104. Also, because the upper surface of air groove forming plate 100 is fixed to the lower surface of ring section 98, chamber 108 is demarcated by the lower surface of ring section 98 and second groove section 106 of air groove 102, and air path 110 is demarcated by the lower surface of ring section 98 and first groove section 104 of air groove 102. According to this configuration, the inside edge section of air path 100 is open at the entire region in the circumferential direction of the inner circumferential surface of air groove forming plate 100, and the outside edge section of air path 110 is open onto chamber 108.

Further, solder cutting device 77 includes compressed air supply device (refer to FIG. 5) 112, and compressed air supply device 112 is connected to chamber 108. Accordingly, when compressed air is supplied to chamber 108 from compressed air supply device 112, compressed air flows into air path 110 via chamber 108, and is ejected towards the inside from the inside edge section of air path 110, that is, an opening to the inner circumferential surface of air groove forming plate 100.

Further, as shown in FIG. 2, fixed lid 78 has ring section 116, and erected section 118 established around the entire circumference at the outer edge of ring section 116. A screw thread (not shown) is formed on the inner circumferential surface of erected section 118, the screw thread being engaged with the screw thread (not shown) formed at the opening end side of outer tube 72. By this, fixed lid 78 is removably attached to the opening of outer tube 72. Also, the inside diameter of ring section 116 is substantially the same as the inside diameter of tube section 96 of inner tube 76, and the end section that extends from solder cup 70 of tube section 96 is fixed to the inside edge of ring section 116.

Also, through-hole 120 is formed in bottom surface 83 of outer tube 72, and air adapter 122 is attached in through-hole 120. Air adapter 122 is connected to an end of air tube 124, and the other end of air tube 124 is connected to positive/negative pressure supply device (refer to FIG. 5) 128. Positive/negative pressure supply device 128 supplies air or sucks air. Thus, pressure is applied inside space 86 inside outer tube 72 by air being supplied from positive/negative pressure supply device 128. Conversely, the pressure inside space 86 inside outer tube 72 is reduced by air being sucked by positive/negative pressure supply device 128.

Figure 5:
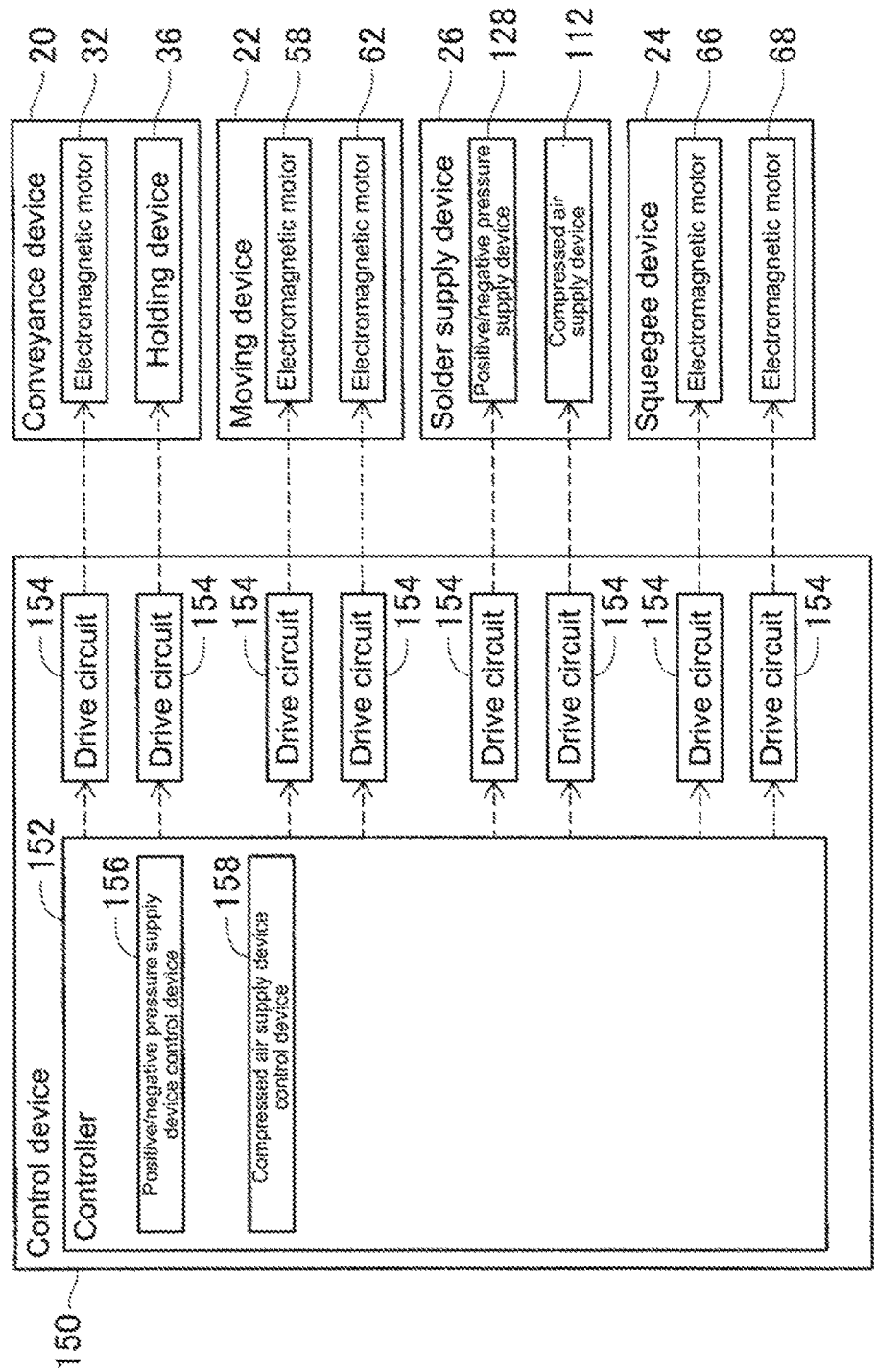
FIG. 5 is a block diagram showing the control device provided in the solder printer of FIG. 1.

Also, as shown in FIG. 5, solder printer 10 is provided with control device 150. Control device 150 is provided with controller 152 and multiple drive circuits 154. Multiple drive circuits 154 are connected to the above-mentioned electromagnetic motors 32, 58, 62, 66, and 68, holding device 36, compressed air supply device 112, and positive/negative pressure supply device 128. Also, controller 152 is provided with a CPU, ROM, RAM, and the like, forming the main parts of a computer, and is connected to the multiple drive circuits 154. Thus, the operation of conveyance device 20, moving device 22, squeegee device 24, and solder supply device 26 is controlled by controller 152.

Printing of Solder Paste to Circuit Board

With solder printer 10, according to the above-described configuration, solder paste is supplied onto the upper surface of a metal mask loaded on circuit board 34 by solder supply device 26, and that solder paste is applied by squeegee device 24. Pattern holes matching the pattern of the pads and so on of circuit board 34 are formed in the metal mask, and solder paste is printed onto circuit board 34 via the pattern holes.

Specifically, based on commands of controller 152, circuit board 34 is conveyed to a work position, and fixedly held at that position by holding device 36. Then, solder supply device 26, based on commands of controller 152, moves to a prescribed position above circuit board 34. Continuing, based on commands of controller 152, solder supply device 26 supplies air from positive/negative pressure supply device 128 to space 86 inside outer tube 72, such that the pressure in space 86 inside outer tube 72 increases. By this, the bottom surface of solder cup 70 is pressed towards supply nozzle 74 and solder cup 70 moves down. In this case, the solder paste filling solder cup 70 is compressed and is ejected from nozzle hole 92 of supply nozzle 74. Solder paste ejected from nozzle hole 92 passes through tube section 96 of inner tube 76, and the inner section of ring section 116 of fixed lid 78, and is supplied to the upper surface of the metal mask loaded on circuit board 34.

Continuing, when a specified amount of solder paste has been supplied, air supply from positive/negative pressure supply device 128 is stopped. When air supply from positive/negative pressure supply device 128 is stopped, the solder paste inside solder cup 70 is no longer compressed, and supply of solder paste from nozzle hole 92 is stopped. However, because the solder paste is viscous, it droops from the tip of nozzle hole 92. Thus, with solder supply device 26, based on commands of controller 152, positive/negative pressure supply device 128 sucks air from space 86 inside outer tube 72. Accordingly, solder cup 70 is pulled back slightly towards space 86, and the pressure inside solder cup 70 decreases. Thus, solder paste drooping from nozzle hole 92 is draw back inside nozzle hole 92.

Further, with solder supply device 26, compressed air is supplied from compressed air supply device 112 to chamber 108 to match the timing of air being sucked by positive/negative pressure supply device 128, that is, to match the timing of the pressure inside solder cup 70 decreasing. Accordingly; compressed air is ejected towards the inside from the inside edge section of air path 110, that is, from the opening at the inner circumferential surface of air groove forming plate 100. Because the opening of air path 110 is positioned at the lower edge of nozzle hole 92, solder paste drooping from nozzle hole 92 is cut by the compressed air. And, because the compressed air is supplied to match the timing of decreasing the pressure inside solder cup 70, solder paste cut by the compressed air is drawn back inside nozzle hole 92. Accordingly, solder paste is reliably prevented from dripping from nozzle hole 92.

When supply of solder paste by solder supply device 26 is complete, squeegee device 24, based on commands of controller 152, moves above the supplied solder paste. Then, based on commands of controller 152, squeegee device 24 moves a squeegee down and then moves in the Y-axis direction. By this, solder paste is applied on the upper surface of the metal mask, and solder paste thus enters into the pattern holes. In this manner, solder printer 10 prints solder paste onto circuit board 34.

As described above, with solder printer 10, when solder supply device 26 stops supplying solder paste, air is sucked from space 86 inside outer tube 72 by positive/negative pressure supply device 128, and compressed air is ejected from the opening of air path 110 to match the timing of the air being sucked. By this, because cutting of solder paste drooping from nozzle hole 92 and drawing back of solder paste drooping from nozzle hole 92 into nozzle hole 92 are performed at the same time, it is possible to reliably prevent solder paste dripping from nozzle hole 92.

Further, with solder paste supply device 26, the internal dimension of air path 110 through which compressed air is ejected is smaller than the internal dimension of chamber 108 into which compressed air is supplied from compressed air supply device 112. Thus, air is ejected smoothly from air path 110, meaning that solder paste is cut suitably.

Further, with solder supply device 26, solder paste ejected from nozzle hole 92 passes through the inside of tube section 96 of inner tube 76 when being supplied onto circuit board 34. Thus, for example, even in a case in which solder paste is scattered by compressed air when solder paste is being cut by compressed air, the scattered solder sticks to tube section 96 and is not scattered outside solder supply device 26. By this, solder printer 10 is not made dirty by solder paste.

Note that, as shown in FIG. 5, controller 152 of control device 150 includes positive/negative pressure supply device control device 156 arid compressed air supply device control device 158. Positive/negative pressure supply device control device 156 is a functional section for sucking air from space 86 of outer tube 72 when supply of solder paste is being stopped; compressed air supply device control device is a functional section for ejecting compressed air from air path 110 to match the timing of air being sucked from space 86 of outer tube 72.

Second Embodiment

Figure 6:
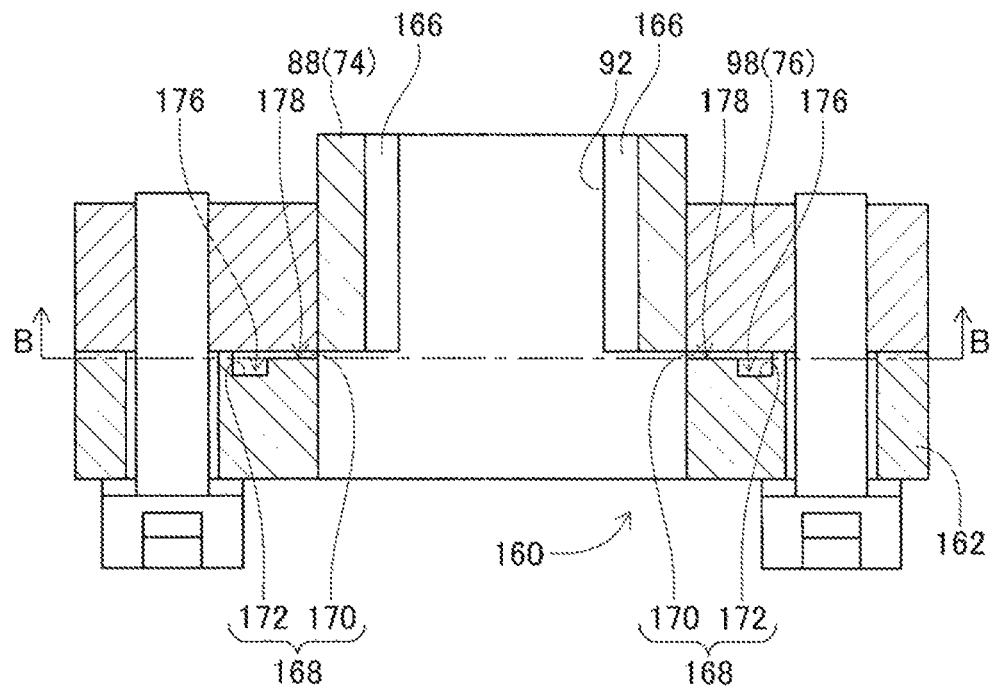
FIG. 6 is an enlarged cross-section view of a second embodiment of a solder cutting device.
Figure 7:
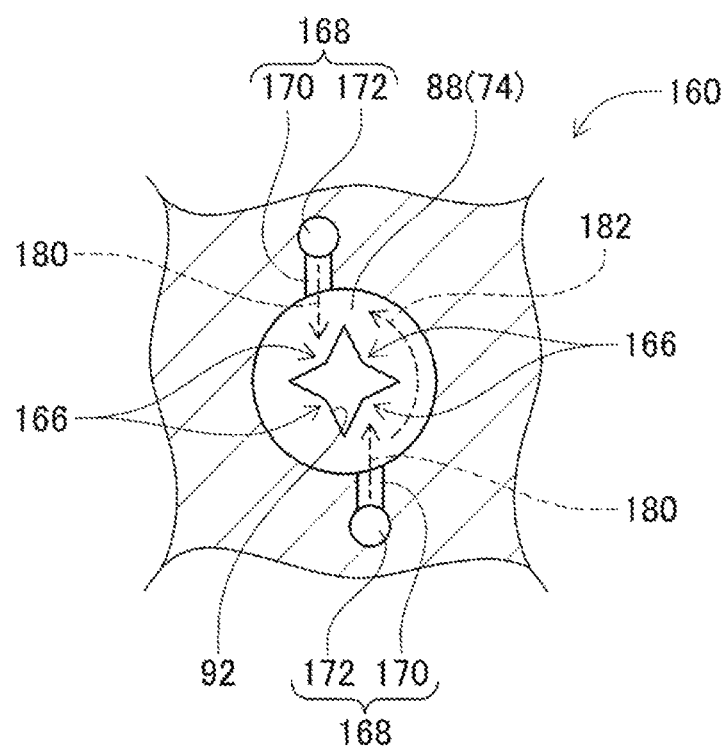
FIG. 7 is a cross section of line BB shown in FIG. 6.

With solder supply device 26 of the first embodiment, solder cutting device 77 in which compressed air is ejected along the entire region in the circumferential direction of solder paste ejected from nozzle hole 92 is used; however, it is possible to use a solder cutting device in which compressed air is ejected at multiple locations in the circumferential direction of solder paste ejected from nozzle 92. Solder cutting device 160 in which compressed air is ejected at multiple locations in the circumferential direction of solder paste ejected from nozzle 92 is shown in FIGS. 6 and 7. Note that, FIG. 6 is an enlarged view of solder paste cutting device 160 fixed to ring section 98 of inner tube 76; FIG. 7 is a cross section of line BB shown in FIG. 6.

Solder cutting device 160 includes air groove forming plate 162 with the same dimensions as air groove forming plate 100 of solder supply device 26, and air groove forming plate 162 is fixed to the lower surface of ring section 98 of inner tube 76. Further, nozzle section 88 of supply nozzle 74 inserted into ring section 98 includes protruding sections 166 that protrude in a chevron shape at four evenly spaced positions on an inner circumferential surface of nozzle section 88. Thus, the shape of a cross section of nozzle hole 92 of nozzle section 88 forms an approximate cross, meaning a cross section of solder paste ejected from nozzle hole 92 is also approximately cross-shaped.

Further, a pair of air grooves 168 is formed on an upper surface of air groove forming plate 162, and each air groove 168 is configured from first groove section 170 and second groove section 172. First air groove section 170 is straight, and an end of first groove section 170 opens on the inner circumferential surface of air groove forming plate 162. Conversely, second groove section is circular, and the other end of first groove section 170 opens into second groove section 172. Second groove section 172 is deeper than first groove section 170.

Further, the direction in which each first groove section 170 of each air groove 168 extends is slightly offset from the diameter direction of the inside diameter of air groove forming plate 162. In detail, each first groove section 170 of each air groove 168 extends in a direction offset from the direction which goes towards the center section of air groove forming plate 162 in the diameter direction, in a counterclockwise direction in the circumferential direction. Note that, the openings of the pair of air grooves 168 to the inner circumferential surface of first groove section 170 are opposite to each other across the center of the inside diameter section of air groove forming plate 162.

Also, because the upper surface of air groove forming plate 162 is fixed to the lower surface of ring section 98, pair of chambers 176 is demarcated by the lower surface of ring section 98 and second groove section 172 of pair of air grooves 168, and air path 178 is demarcated by the lower surface of ring section 98 and pair of air grooves 168 of first groove section 170. Note that, compressed air supply device 112 is connected to pair of chambers 176.

According to this configuration, with solder cutting device 160, when compressed air is supplied to each chamber 176 from compressed air supply device 112, compressed air flows through each air path 178 via each chamber 176. And, compressed air is ejected towards the inside from the inside edge section of air path 178, that is, from the opening at the inner circumferential surface of air groove forming plate 162 (refer to arrow 180 in FIG. 7). Here, as described above, because the direction in which first groove section 170 of air path 178 extends is offset from the direction which goes towards the center section of air groove forming plate 162 in the diameter direction, in a counterclockwise direction in the circumferential direction, solder paste ejected from nozzle hole 92 is twisted in a counterclockwise direction by the compressed air (refer to arrow 182 in FIG. 7).

In particular, with the second embodiment, the cross section of solder paste ejected from nozzle hole 92 is cross-shaped, and first groove section 170 of air groove 168 is formed such that compressed air is ejected towards a side surface of a protruding section of the cross shape. Thus, solder paste ejected from nozzle hole 92 is twisted and cut by a large force of the compressed air.

In this way, with solder cutting device 160, solder paste is cut by compressed air being ejected at multiple locations in the circumferential direction of solder paste ejected from nozzle hole 92, such that the solder paste is subjected to a twisting force. Note that, in a similar manner to solder cutting device 77 above, with solder cutting device 160 also, by supplying compressed air to match the timing of air being sucked by positive/negative pressure supply device 128, dripping of solder paste from nozzle hole 92 is reliably prevented.

Note that, in the above embodiments, solder supply device 26 is an example of a solder supply device. Solder cup 70 is an example of a housing case. Supply nozzle 74 is an example of a dispensing nozzle. Solder cutting device 77 is an example of a solder cutting device. Tube section 96 is an example of a surrounding wall. Chamber 108 is an example of a chamber. The opening of air path 110 is an example of an outlet. Compressed air supply device 112 is an example of a gas supply device. Positive/negative pressure supply device 128 is an example of an internal pressure changing device. Control device 150 is an example of a control device. Positive/negative pressure supply device control device 156 is an example of an internal pressure changing device control device. Compressed air supply device control device 158 is an example of a solder cutting device control device. Solder cutting device 160 is an example of a solder cutting device. Protruding section 166 is an example of a protruding section. Chamber 176 is an example of a chamber. The opening of air path 178 is an example of an outlet.

Further, the present disclosure is not limited to the above example embodiments, and various changed or improved methods of embodiment are possible based on the knowledge of someone skilled in the art. Specifically, for example, in the above embodiment, a solder supply device that moves solder cup 70 by supplying air to space 86 demarcated by solder cup 70 and outer tube 72 and so on is used; however, a solder supply device that moves solder cup 70 using a drive source such as a cylinder device or electromagnetic motor may be used.

Also, in the above embodiments, a solder supply device that supplies solder paste from solder cup 70 by moving solder cup 70 is used; however, a solder supply device that supplies solder paste from solder cup 70 by moving supply nozzles 74 may be used.

Also, in the above embodiments, a solder supply device that supplies solder paste directly from solder cup 70 is used; however, a solder supply device that supplies solder paste from a different housing case to which solder paste has been transferred from solder cup 70 may be used.

Further, with the present disclosure, sucking of air from space 86 of outer tube 72 and ejecting of compressed air from air path 110 may be performed with matching time.

Thus, sucking air from space 86 and ejecting compressed air may be performed at the same time. Alternatively, compressed air may be ejected immediately after air is sucked from space 86. Alternatively, air may be sucked from space 86 immediately after compressed air is ejected.

REFERENCE SIGNS LIST

26: solder supply device; 70: solder cup (housing case); 74: supply nozzle (dispensing nozzle); 77: solder cutting device; 96: tube section (surrounding wall); 108: chamber; 110: air path (outlet); 112: compressed air supply device (gas supply device); 128: positive/negative pressure supply device (internal pressure changing device); 150: control device; 156: positive/negative pressure supply device control device (internal pressure changing device control device); 158: compressed air supply device control device (solder cutting device control device); 160: solder cutting device; 166: protruding section; 176: chamber; 178: air passage (outlet)

The invention claimed is:

1. A solder supply device comprising:
   a housing case configured to house liquid solder inside;
   an outer tube inside which the housing case is stored, a space being formed between a bottom surface of the housing case and a bottom surface of the outer tube;
   an internal pressure changing device configured to change the pressure inside the housing case;
   a dispensing nozzle configured to dispense solder housed in the housing case;
   a solder cutting device configured to cut solder supplied from the dispensing nozzle using ejection of a gas; and
   a control device configured to control operation of the solder cutting device and the internal pressure changing device,
   wherein the solder supply device supplies solder from the dispensing nozzle using the internal pressure changing device to supply air to the space so as to increase pressure inside the housing case, and
   wherein the control device includes
      an internal pressure changing device control section configured to control operation of the internal pressure changing device to suck air from the space such that pressure inside the housing case decreases and the housing case is pulled back towards the space when supply of solder from the dispensing nozzle is stopped, and
      a solder cutting device control section configured to control the solder cutting device such that solder is cut by ejecting a gas as pressure inside the housing case is decreased by control of the internal pressure changing device control section.

2. The solder supply device according to claim 1, wherein the solder cutting device includes an outlet that opens across the entire region in a circumferential direction of an internal circumferential surface of the dispensing nozzle, and wherein
   the outlet ejects gas towards the inside of the dispensing nozzle.

3. The solder supply device according to claim 1, wherein the solder cutting device includes multiple outlets arranged in a circumferential direction of an internal circumferential surface of the dispensing nozzle, and wherein
   each of the outlets ejects gas from a direction towards a center section in the diameter direction of the dispensing nozzle towards a direction deviated in one direction in the circumferential direction of the dispensing nozzle.

4. The solder supply device according to claim 3, further wherein
multiple protruding sections that protrude towards the inside of the dispensing nozzle are formed on an internal circumferential surface of the dispensing nozzle positioned at an upstream side of the multiple outlets.

5. The solder supply device according to claim 2, wherein
the solder cutting device includes a chamber connected to the outlet to which air is supplied from an air supply device, and wherein
an internal dimension of the outlet is smaller than an internal dimension of the chamber.

6. The solder supply device according to claim 1, wherein
the solder supply device is provided with a surrounding wall that surrounds the outlet of the dispensing nozzle.

7. A solder supply method for supplying solder from a solder supply device
according to claim 1, the solder supply method comprising:
supplying solder from the dispensing nozzle using the internal pressure changing device to supply air to the space so as to increase pressure inside the housing case;
stopping solder supply from the dispensing nozzle by using the internal pressure changing device to suck air from the space such that pressure inside the housing case decreases and the housing case is pulled back towards the space; and
cutting solder by blowing gas on the solder using the solder cutting device as pressure inside the housing case is decreased using the internal pressure changing device.

8. The solder supply device according to claim 3, wherein
the solder cutting device includes a chamber connected to the outlet to which air is supplied from an air supply device, and wherein
an internal dimension of the outlet is smaller than an internal dimension of the chamber.

9. The solder supply device according to claim 4, wherein
the solder cutting device includes a chamber connected to the outlet to which air is supplied from an air supply device, and wherein
an internal dimension of the outlet is smaller than an internal dimension of the chamber.

10. The solder supply device according to claim 2, wherein
the solder supply device is provided with a surrounding wall that surrounds the outlet of the dispensing nozzle.

11. The solder supply device according to claim 3, wherein
the solder supply device is provided with a surrounding wall that surrounds the outlet of the dispensing nozzle.

12. The solder supply device according to claim 4, wherein
the solder supply device is provided with a surrounding wall that surrounds the outlet of the dispensing nozzle.

13. The solder supply device according to claim 5, wherein
the solder supply device is provided with a surrounding wall that surrounds the outlet of the dispensing nozzle.

14. The solder supply device according to claim 1, wherein
the housing case includes a flange section provided on an outer circumferential surface thereof at an opening side of the housing case,
the outer tube includes a first inner circumferential surface positioned at an opening side of the outer tube, and a second inner circumferential surface positioned at the bottom surface of the outer tube, an inside diameter of the first inner circumferential surface being larger than an outer diameter of the flange section of the housing case, and an inside diameter of the second inner circumferential surface being larger than an outside diameter of a tubular section of the housing case.

* * * * *